United States Patent [19]

Chen

[11] Patent Number: 5,479,669
[45] Date of Patent: Jan. 2, 1996

[54] MULTI-PURPOSE TOOL FOR IC

[76] Inventor: Wen S. Chen, P.O. Box 82-144, Taipei, Taiwan

[21] Appl. No.: 289,784

[22] Filed: Aug. 12, 1994

[51] Int. Cl.⁶ .............................. B25F 1/00; B23P 19/00
[52] U.S. Cl. ........................... 7/107; 29/758; 29/764
[58] Field of Search ............................. 7/107, 167, 168, 7/170; 29/837, 838, 758, 764, 829, 278, 832, 741, 739

[56] References Cited

U.S. PATENT DOCUMENTS

| | | | |
|---|---|---|---|
| 4,141,138 | 2/1979 | Quick | 29/758 X |
| 5,046,237 | 9/1991 | Conforti et al. | 29/758 X |
| 5,230,143 | 7/1993 | Karlovich | 29/758 X |
| 5,265,328 | 11/1993 | Gorman | 29/829 |
| 5,361,492 | 11/1994 | Miyazawa | 29/837 X |

*Primary Examiner*—D. S. Meislin
*Attorney, Agent, or Firm*—Alfred Lei

[57] ABSTRACT

A multi-purpose tool for IC including a body having a left portion, a right portion, and an intermediate portion fitted between the left portion and the right portion, a pair of inner arms each pivotally connected with an upper end of the left portion and the right portion, and a pair of outer arms each pivotally connected with an upper end of the left portion and the right portion, whereby the tool can be for straightening the feet of a IC, engaging a IC with a seat, and disengaging a IC from a seat.

1 Claim, 8 Drawing Sheets

MULTI-PURPOSE TOOL FOR IC

BACKGROUND OF THE INVENTION

It has been found that separate tools are required for straightening the feet of a IC, engaging a IC with a seat, and disengaging a IC from a seat thereby causing much inconvenience in use. Furthermore, it will cost a lot of money to prepare three kinds of tools.

Therefore, it is an object of the present invention to provide a multi-purpose tool for IC which can obviate and mitigate the above-mentioned drawbacks.

SUMMARY OF THE INVENTION

This invention relates to a multi-purpose tool for IC.

It is the primary object of the present invention to provide a multi-purpose tool for IC which can be used to straightening the feet of a IC.

It is another object of the present invention to provide a multi-purpose tool for IC which can facilitate the engagement between a IC with a seat.

It is still another object of the present invention to provide a multi-purpose tool for IC which can facilitate the disengagement of a IC from a seat.

It is still another object of the present invention to provide a multi-purpose tool for IC which is simple in construction.

It is a further object of the present invention to provide a multi-purpose tool for IC which is practical in use.

The other objects and merits and a fuller understanding of the present invention will be obtained by those having ordinary skill in the art when the following detailed description is read in conjunction with the accompanying drawings wherein like numerals refer to like or similar part.

DETAILED DESCRIPTION OF THE PREFERRED EMBODIMENT

Figure 1:
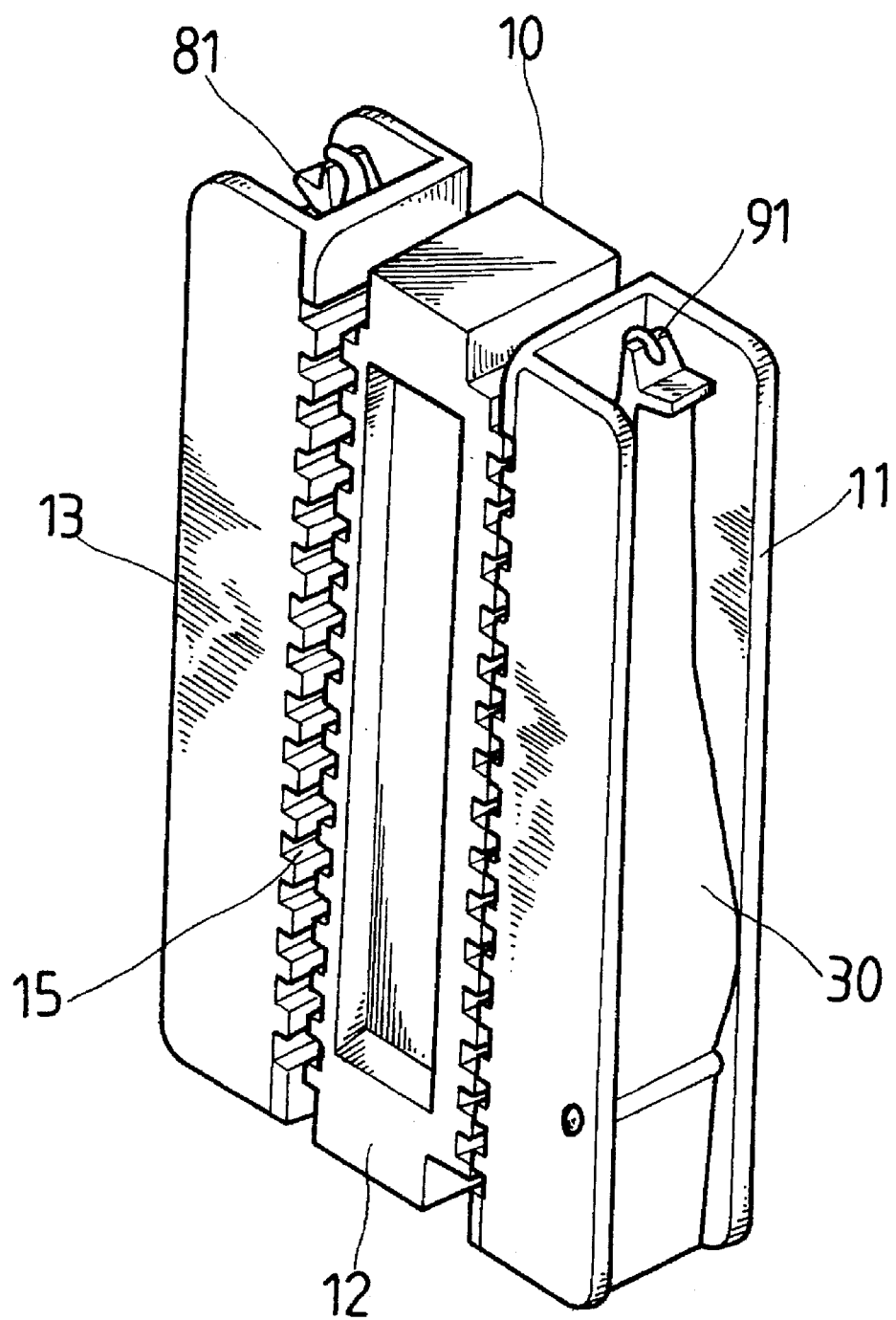
FIG. 1 is a perspective view of the present invention.
Figure 2:
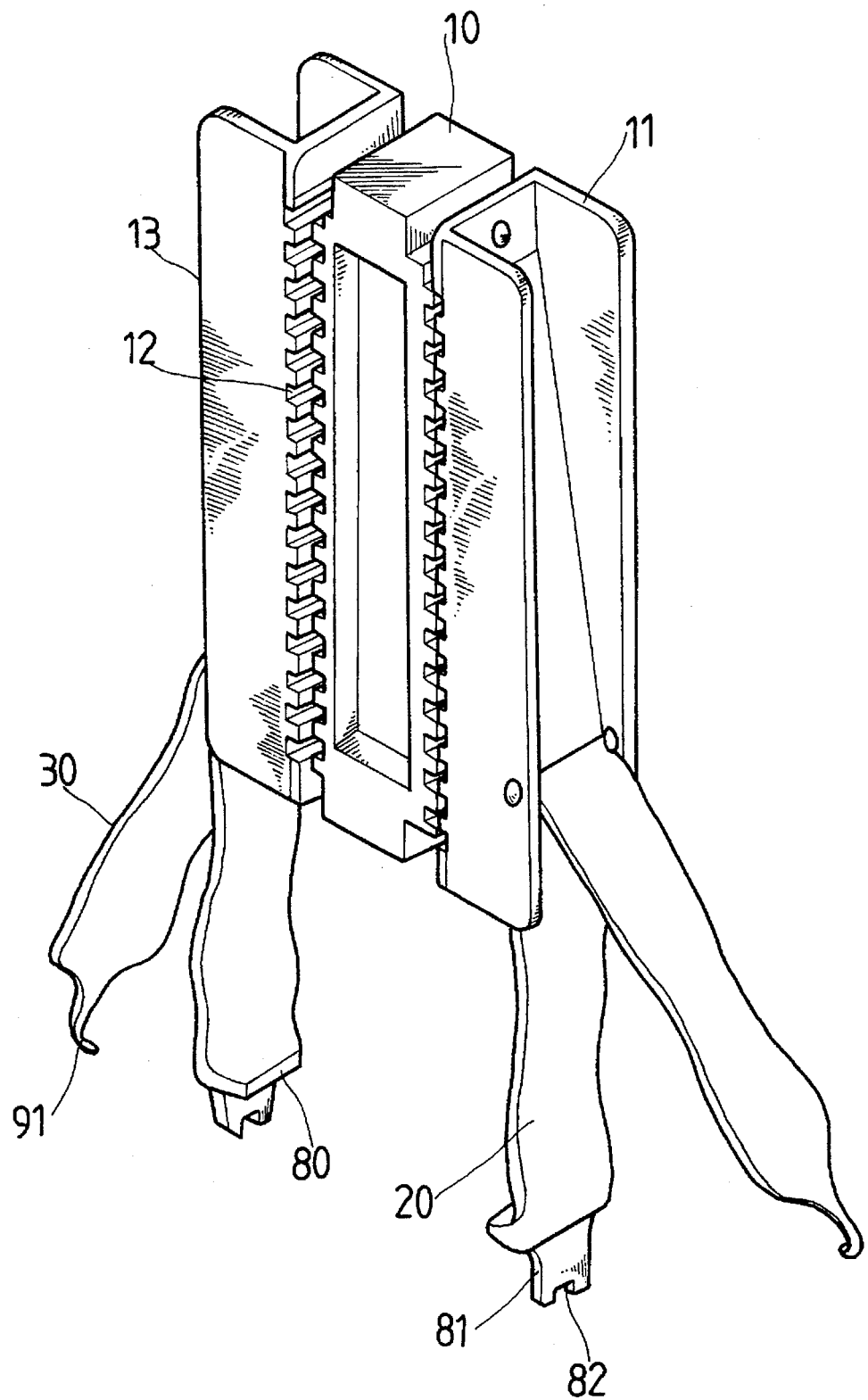
FIG. 2 is a perspective view showing the open condition of the present invention.
Figure 3:
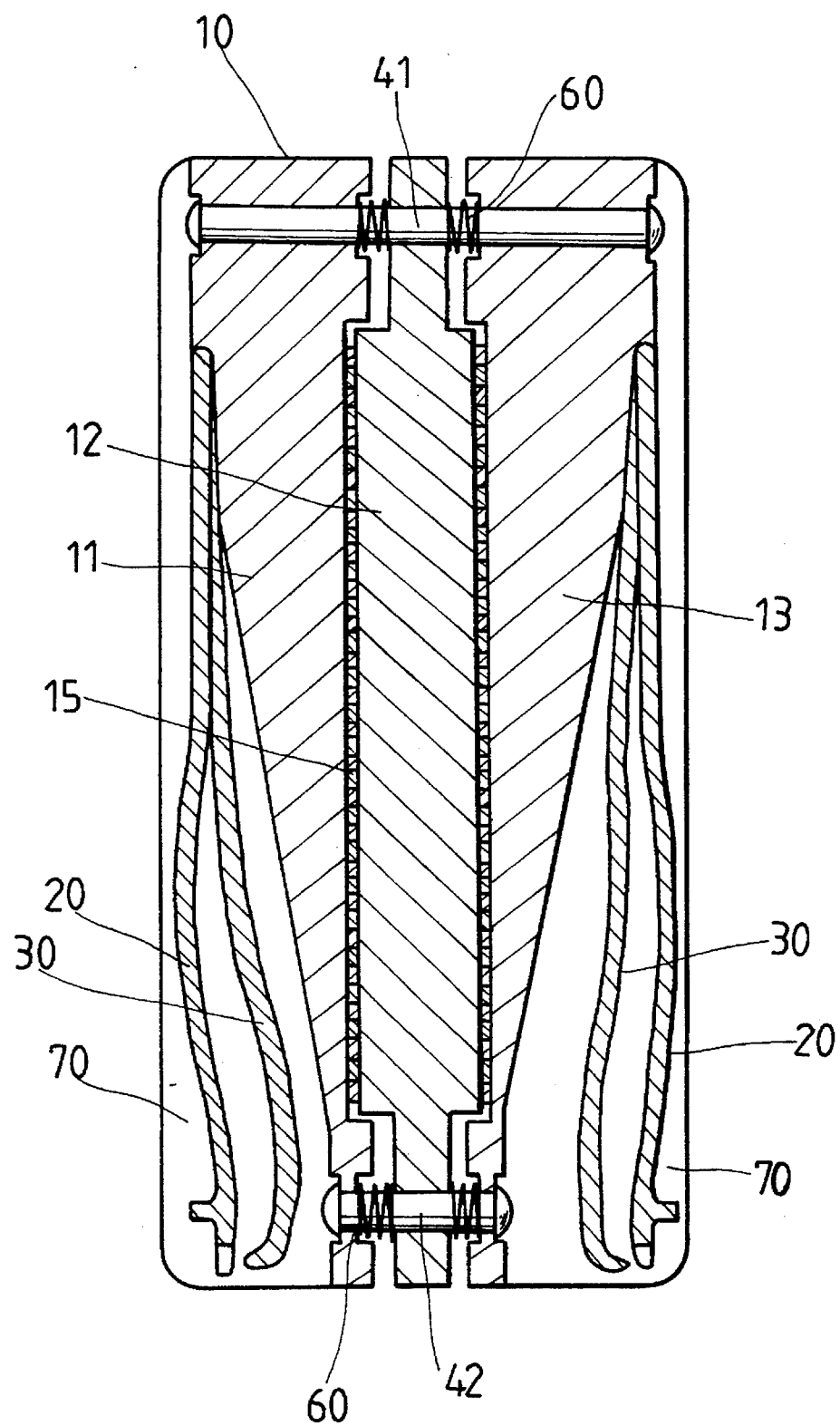
FIG. 3 is a sectional view of the present invention.
Figure 4:
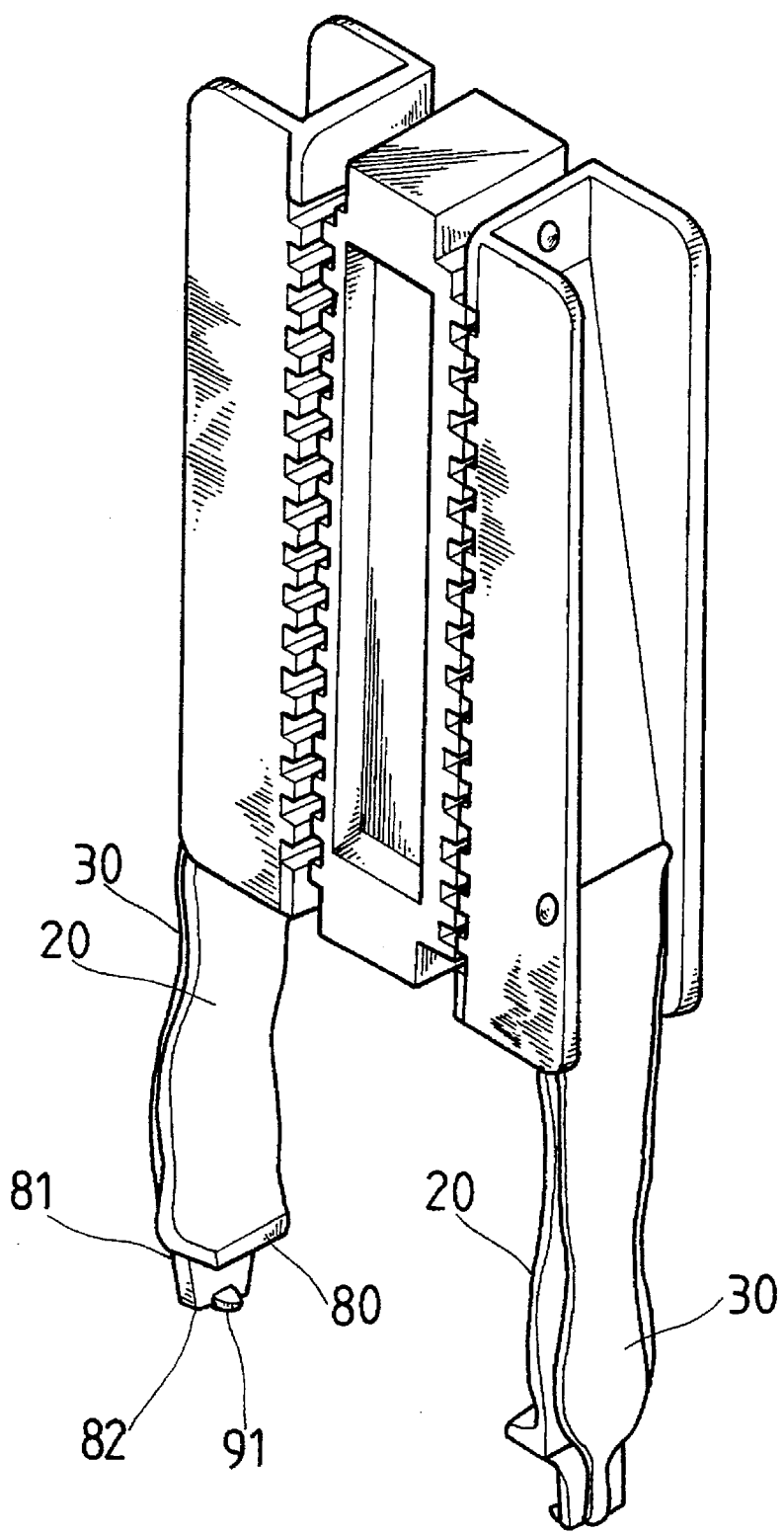
FIG. 4 is a perspective view showing the engagement between the inner arm and the outer arm.

For the purpose of promoting an understanding of the principles of the invention, reference will now be made to embodiment illustrated in the drawings. Specific language will be used to describe same. It will, nevertheless, be understood that no limitation of the scope of the invention is thereby intended, such alternations and further modifications in the illustrated device, and such further applications of the principles of the invention as illustrated herein being contemplated as would normally occur to one skilled in the art to which the invention relates.

With reference to the drawings and in particular to FIGS. 1, 2, 3 and 4 thereof, the multi-purpose tool for IC according to the present invention mainly comprises a body 10, a pair of inner arms 20, and a pair of outer arms 30.

The body 10 includes a left portion 11, a right portion 13, and an intermediate portion 12 fitted between the left portion 11 and the right portion 13. The left portion 11, the right portion 13 and the intermediate portion 12 are joined together by an upper bolt 41 and a lower bolt 42. Between the upper ends the left portion 11 and the intermediate portion 41 there is a first spring 60 enclosing the bolt 41. Between upper ends of the right portion 13 and the intermediate portion 12 there is a second spring 60 enclosing the bolt 41. Between the lower ends of the left portion 11 and the intermediate portion 12 there is a third spring 60. Between the lower ends of the right portion 13 and the intermediate portion 12 there is a fourth spring 60. The inner side of the left portion 11, both sides of the intermediate portion 12, and the inner side of the right portion 13 are formed with a plurality of teeth 15. The left portion 11 and the right portion 13 have a recess 70 at the outer side. An inner arm 20 and an outer arm 30 are pivotally connected with the upper end of each of the left portion 12 and right portion 13, the connection therebetween being well known to those having ordinary skill in the art and being not considered a part of the invention. The inner arm 20 is formed at the inner end with a flange 80 and a leg 81 under the flange 80. The leg 81 has a notch 82 at the lower edge. The outer arm 30 is formed at the lower end with a hook engageable with the notch 82 of the leg 81 of the inner arms. The outer arm 30 and the inner arm 20 are received in the recess 70 when not in use.

Figure 5A:
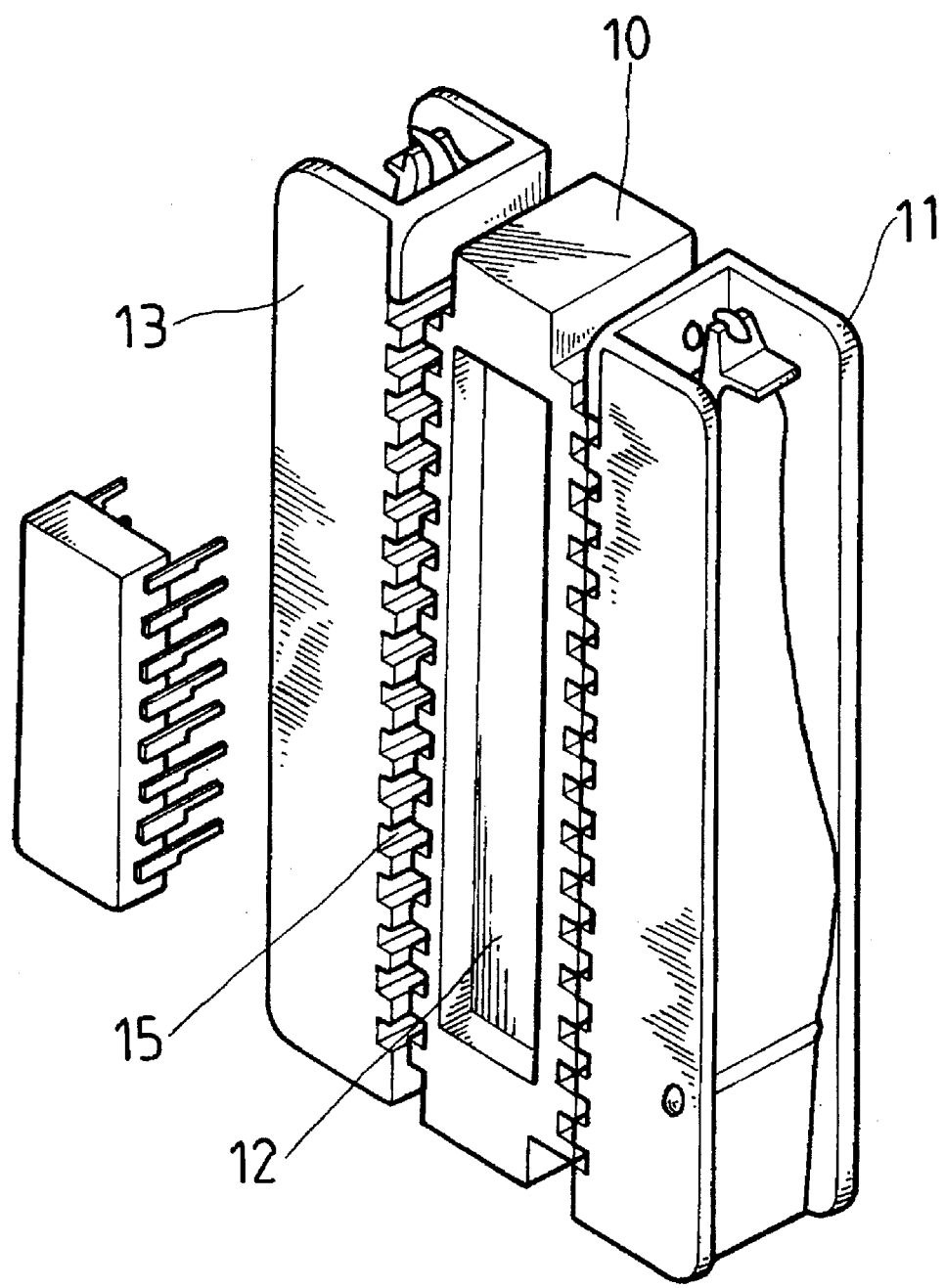
FIGS. 5A and 5B show the way to straighten the feet of a IC.
Figure 5B:
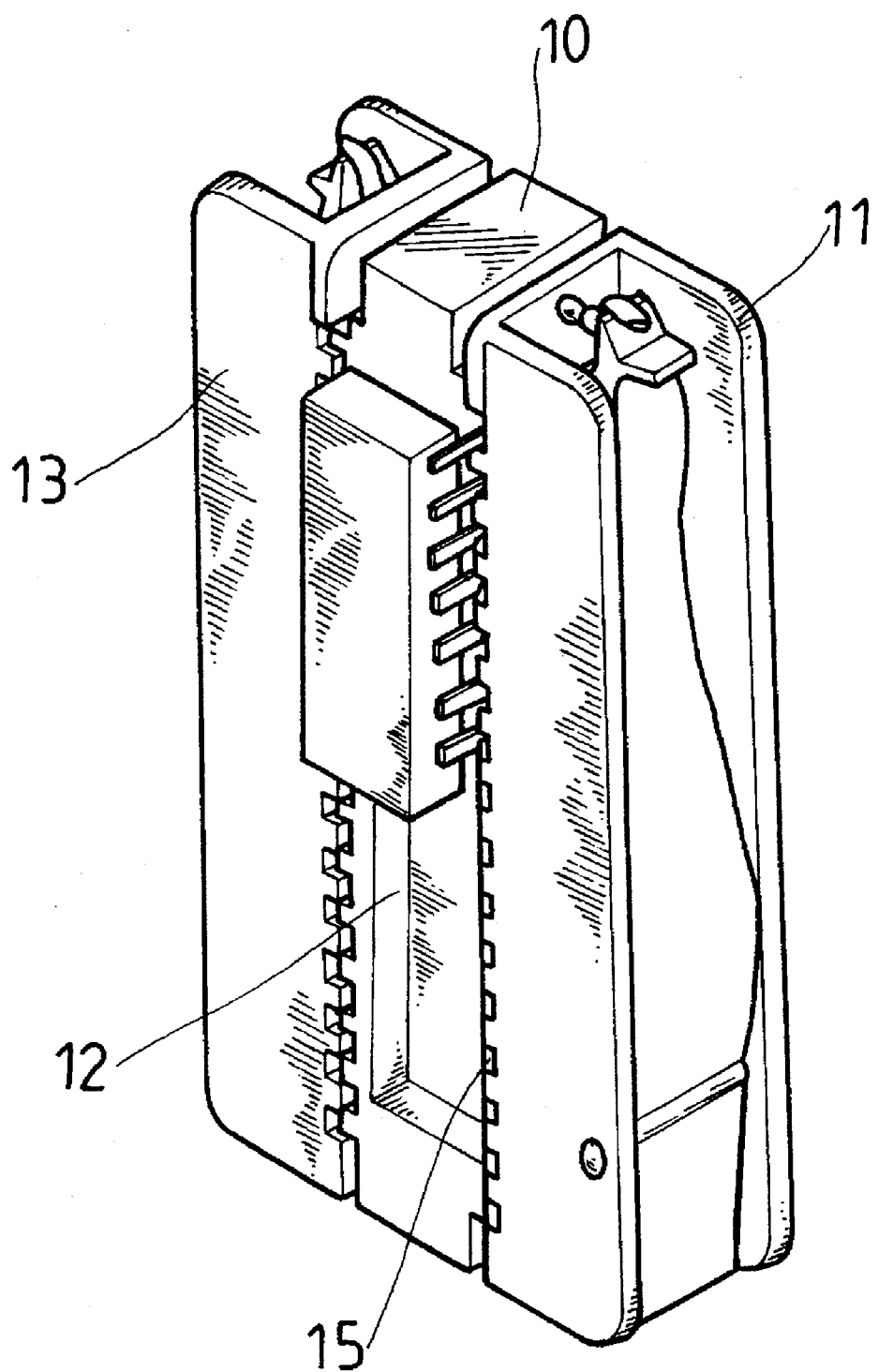
Figure 6:
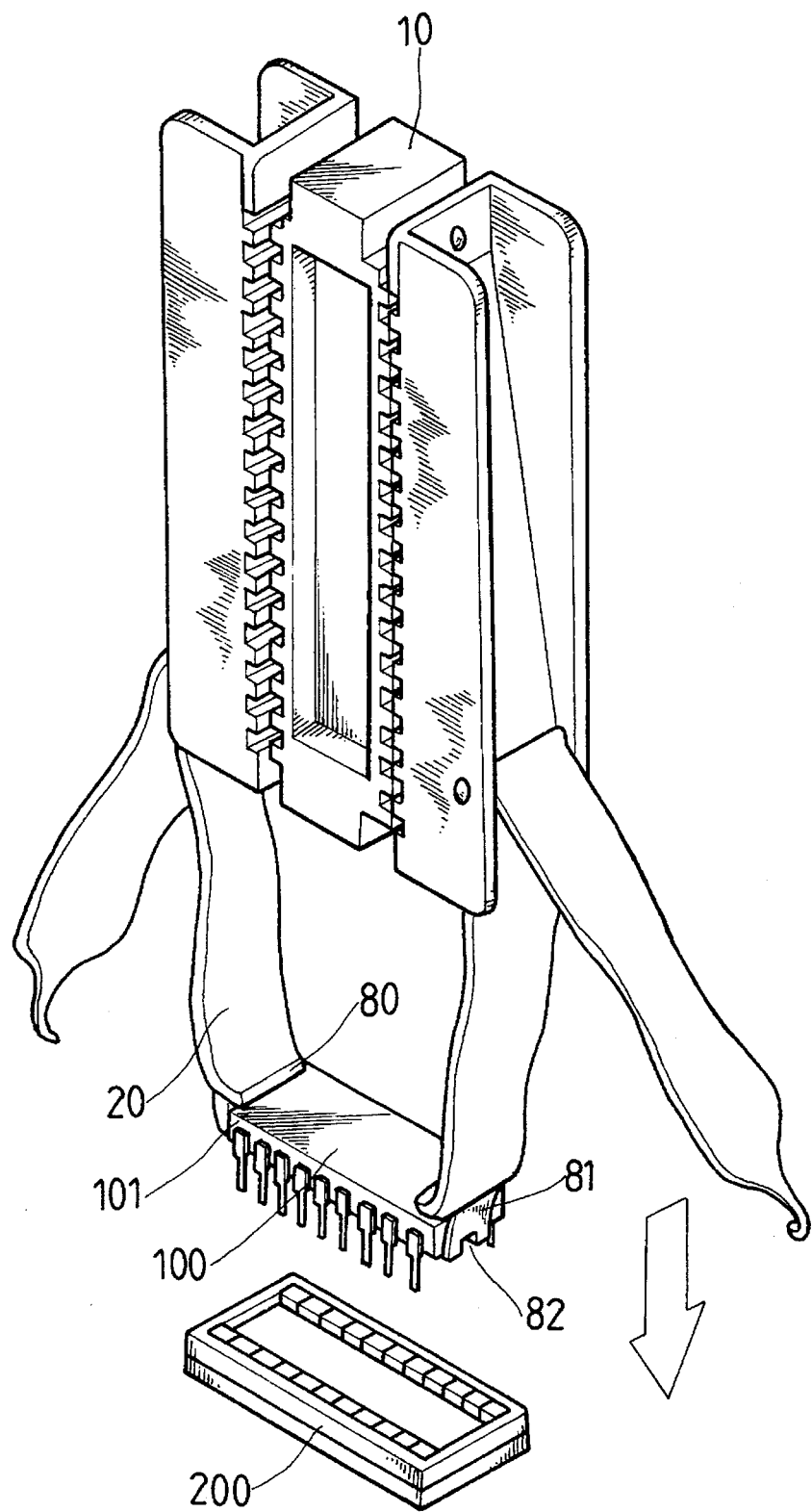
FIG. 6 shows the way to engage a IC with a seat.
Figure 7:
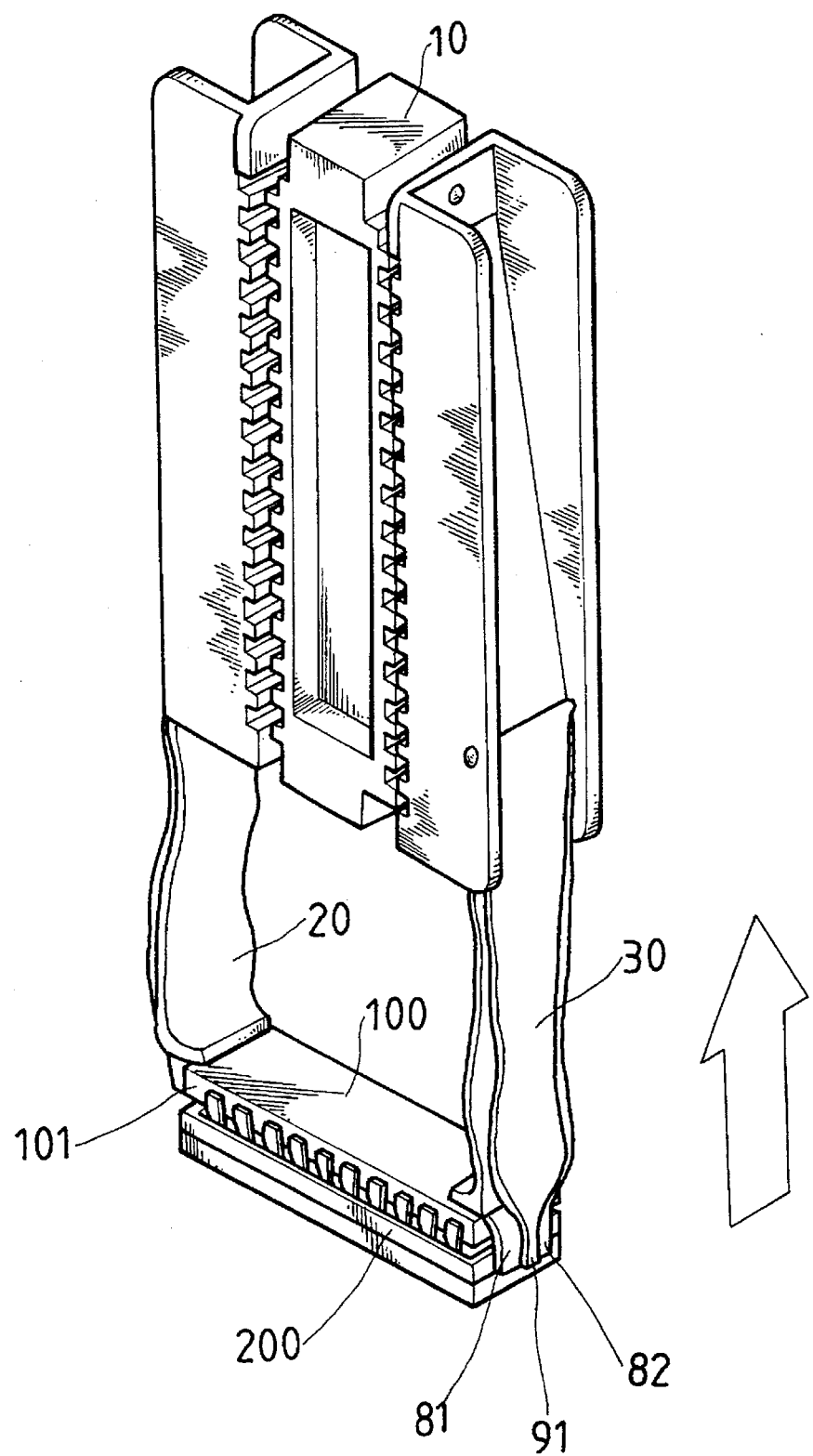
FIG. 7 shows the way to disengage a IC from a seat.

When required to straighten the feet of an IC, simply insert the feet of the IC between the teeth 15 of the left portion 11, the right portion 13 and the intermediate portion 12 and then press the left portion 11 and the right portion 13 towards the intermediate portion 12 thereby straightening the feet of the IC (see FIGS. 5A and 5B).

When required to insert a IC into a seat, first engage the inner arms 20 with the IC, with each end 101 of the IC 100 fitted between the flange 80 and the leg 82 of the inner arm 20, and then lower down the body 10 to push the IC 100 into the seat 200.

When required to disengage a IC 100 from a seat 200, first fit the IC 100 between the lower ends of the inner arms 20 and then engage the hooks 91 of the outer arms 30 with the bottom of the IC thereby enabling the IC 100 to be pulled up from the seat 200.

The invention is naturally not limited in any sense to the particular features specified in the forgoing or to the details of the particular embodiment which has been chosen in order to illustrate the invention. Consideration can be given to all kinds of variants of the particular embodiment which has been described by way of example and of its constituent elements without thereby departing from the scope of the invention. This invention accordingly includes all the means constituting technical equivalents of the means described as well as their combinations.

I claim:

1. A multi-purpose tool for IC comprising:

a body including a left portion, a right portion, and an intermediate portion fitted between the left portion and the right portion, said left portion being formed with a plurality of transverse teeth at an inner side, said right portion being formed with a plurality of transverse teeth at an inner side, said intermediate portion being formed at both inner sides with a plurality of transverse teeth adapted to engage the teeth of said left portion and said right portion;

a pair of inner arms each pivotally connected with an upper end of said left portion and said right portion, each of said inner arms being formed at an inner end with a flange and a leg under the flange, said leg having a notch at a lower edge; and a pair of outer arms each pivotally connected with an upper end of said left portion and said right portion, each of said outer arms being formed at a lower end with a hook engageable with the notch of the leg of said inner arms.

* * * * *